United States Patent
Butendeich et al.

(10) Patent No.: US 9,583,670 B2
(45) Date of Patent: Feb. 28, 2017

(54) LUMINESCENCE CONVERSION ELEMENT AND OPTOELECTRONIC SEMICONDUCTOR COMPONENT COMPRISING SUCH A LUMINESCENCE CONVERSION ELEMENT AND METHOD OF PRODUCING SAME

(71) Applicant: OSRAM Opto Semiconductors GmbH, Regensburg (DE)

(72) Inventors: Rainer Butendeich, Regensburg (DE); Hailing Cui, Regensburg (DE); Reiner Windisch, Pettendorf (DE); Jörg Frischeisen, Schwabmünchen (DE); Stefan Lange, Augsburg (DE)

(73) Assignee: OSRAM Opto Semiconductor GmbH (DE)

( * ) Notice: Subject to any disclaimer, the term of this patent is extended or adjusted under 35 U.S.C. 154(b) by 0 days.

(21) Appl. No.: 15/036,893

(22) PCT Filed: Nov. 17, 2014

(86) PCT No.: PCT/EP2014/074782
§ 371 (c)(1),
(2) Date: May 16, 2016

(87) PCT Pub. No.: WO2015/078717
PCT Pub. Date: Jun. 4, 2015

(65) Prior Publication Data
US 2016/0329470 A1   Nov. 10, 2016

(30) Foreign Application Priority Data

Nov. 28, 2013  (DE) .................. 10 2013 113 188

(51) Int. Cl.
*H01L 33/00* (2010.01)
*H01L 33/44* (2010.01)
(Continued)

(52) U.S. Cl.
CPC ............... *H01L 33/00* (2013.01); *F21V 9/16* (2013.01); *H01L 25/0753* (2013.01); *H01L 2933/0041* (2013.01); *H01L 2933/0091* (2013.01)

(58) Field of Classification Search
CPC . H01L 33/504; H01L 33/005; H01L 25/0753; F21V 9/16
(Continued)

(56) References Cited

U.S. PATENT DOCUMENTS

2006/0027781 A1* 2/2006 Dong .................. C09K 11/592
                                                      252/62.52
2006/0208262 A1* 9/2006 Sakuma ................ C04B 35/597
                                                      257/79
(Continued)

FOREIGN PATENT DOCUMENTS

DE   11 2005 000 396 T5   2/2007
DE   10 2008 021 662 A1   11/2009
(Continued)

*Primary Examiner* — Dao H Nguyen
(74) *Attorney, Agent, or Firm* — DLA Piper LLP (US)

(57) ABSTRACT

A luminescence conversion element for wavelength conversion of primary electromagnetic radiation into secondary electromagnetic radiation includes first luminescent material particles that, when excited by the primary electromagnetic radiation, emit a first electromagnetic radiation, a peak wavelength of which is at least 515 nm to at most 550 nm of a green region of the electromagnetic spectrum; second luminescent material particles that, when excited by the primary electromagnetic radiation, emit a second electromagnetic radiation, a peak wavelength of which is at least 595 nm to at most 612 nm of a yellow-red region of the electromagnetic spectrum; and third luminescent material particles that, when excited by the primary electromagnetic radiation, emit a third electromagnetic radiation, a peak wavelength of which is at least 625 nm to at most 660 nm of a red region of the electromagnetic spectrum.

19 Claims, 4 Drawing Sheets (51) Int. Cl.
*F21V 9/16* (2006.01)
*H01L 25/075* (2006.01)

(58) Field of Classification Search
USPC ............... 257/89, 98, 99, E33.005, E33.058, 257/E33.061, E33.067, E27.12; 349/5, 349/20; 438/22, 27, 29
See application file for complete search history.

(56) References Cited

U.S. PATENT DOCUMENTS

| | | | |
|---|---|---|---|
| 2009/0294731 A1* | 12/2009 | Li | C09K 11/7734 252/301.4 R |
| 2010/0019261 A1* | 1/2010 | Scianna | B82Y 20/00 257/98 |
| 2010/0038665 A1 | 2/2010 | Sugiura et al. | |
| 2011/0309399 A1* | 12/2011 | Shinohara | C09K 11/0883 257/98 |
| 2015/0300601 A1* | 10/2015 | Windisch | H01L 33/504 438/27 |

FOREIGN PATENT DOCUMENTS

| | | |
|---|---|---|
| DE | 20 2009 016 962 US | 6/2010 |
| DE | 10 2011 078 402 A1 | 1/2013 |
| DE | 11 2011 102 386 T5 | 4/2013 |
| EP | 1 630 220 A2 | 3/2006 |
| EP | 2 428 543 A1 | 3/2012 |
| EP | 2 650 934 A1 | 10/2013 |
| EP | 2 657 998 A2 | 10/2013 |

\* cited by examiner

LUMINESCENCE CONVERSION ELEMENT AND OPTOELECTRONIC SEMICONDUCTOR COMPONENT COMPRISING SUCH A LUMINESCENCE CONVERSION ELEMENT AND METHOD OF PRODUCING SAME

TECHNICAL FIELD

This disclosure relates to a luminescence conversion element and optoelectronic semiconductor component including such a luminescence conversion element and method of producing same.

BACKGROUND

DE 102011078402 A1 describes a conversion element and a light-emitting diode with such a conversion element.

It could nonetheless be helpful to provide a luminescence conversion element suitable to generate electromagnetic radiation with predefinable spectral characteristics, an optoelectronic semiconductor component, and a method of producing such an optoelectronic semiconductor component that emits electromagnetic radiation with predefinable spectral characteristics.

SUMMARY

We provide a luminescence conversion element for wavelength conversion of primary electromagnetic radiation into secondary electromagnetic radiation, including first luminescent material particles that, when excited by the primary electromagnetic radiation, emit a first electromagnetic radiation, a peak wavelength of which is at least 515 nm to at most 550 nm of a green region of the electromagnetic spectrum; second luminescent material particles that, when excited by the primary electromagnetic radiation, emit a second electromagnetic radiation, a peak wavelength of which is at least 595 nm to at most 612 nm of a yellow-red region of the electromagnetic spectrum; and third luminescent material particles that, when excited by the primary electromagnetic radiation, emit a third electromagnetic radiation, a peak wavelength of which is at least 625 nm to at most 660 nm of a red region of the electromagnetic spectrum, wherein the first, second and third luminescent material particles each consist of different materials, a peak wavelength of the primary radiation lies in a blue region of the electromagnetic spectrum, the luminescence conversion element, when excited energetically by the primary radiation, emits secondary radiation containing the first, second and third electromagnetic radiation, and a correlated color temperature of a mixed radiation consisting of portions of the primary radiation and the secondary radiation corresponds to a color temperature of white light.

We also provide a optoelectronic semiconductor component including the luminescence conversion element for wavelength conversion of primary electromagnetic radiation into secondary electromagnetic radiation, including first luminescent material particles that, when excited by the primary electromagnetic radiation, emit a first electromagnetic radiation, a peak wavelength of which is at least 515 nm to at most 550 nm of a green region of the electromagnetic spectrum; second luminescent material particles that, when excited by the primary electromagnetic radiation, emit a second electromagnetic radiation, a peak wavelength of which is at least 595 nm to at most 612 nm of a yellow-red region of the electromagnetic spectrum; and third luminescent material particles that, when excited by the primary electromagnetic radiation, emit a third electromagnetic radiation, a peak wavelength of which is at least 625 nm to at most 660 nm of a red region of the electromagnetic spectrum, wherein the first, second and third luminescent material particles each consist of different materials, a peak wavelength of the primary radiation lies in a blue region of the electromagnetic spectrum, the luminescence conversion element, when excited energetically by the primary radiation, emits secondary radiation containing the first, second and third electromagnetic radiation, and a correlated color temperature of a mixed radiation consisting of portions of the primary radiation and the secondary radiation corresponds to a color temperature of white light; and at least one optoelectronic semiconductor chip that emits the primary radiation when in operation, wherein the luminescence conversion element is arranged downstream of the optoelectronic semiconductor chip such that at least a portion of the primary radiation emitted by the at least one optoelectronic semiconductor chip enters the luminescence conversion element, and the optoelectronic semiconductor component emits the mixed radiation.

We further provide a method of producing an optoelectronic semiconductor component that emits white light of a predefinable color temperature, including providing the luminescence conversion element for wavelength conversion of primary electromagnetic radiation into secondary electromagnetic radiation, including first luminescent material particles that, when excited by the primary electromagnetic radiation, emit a first electromagnetic radiation, a peak wavelength of which is at least 515 nm to at most 550 nm of a green region of the electromagnetic spectrum; second luminescent material particles that, when excited by the primary electromagnetic radiation, emit a second electromagnetic radiation, a peak wavelength of which is at least 595 nm to at most 612 nm of a yellow-red region of the electromagnetic spectrum; and third luminescent material particles that, when excited by the primary electromagnetic radiation, emit a third electromagnetic radiation, a peak wavelength of which is at least 625 nm to at most 660 nm of a red region of the electromagnetic spectrum, wherein the first, second and third luminescent material particles each consist of different materials, a peak wavelength of the primary radiation lies in a blue region of the electromagnetic spectrum, the luminescence conversion element, when excited energetically by the primary radiation, emits secondary radiation containing the first, second and third electromagnetic radiation, and a correlated color temperature of a mixed radiation consisting of portions of the primary radiation and the secondary radiation corresponds to a color temperature of white light, wherein a respective concentration of the first luminescent material particles, the second luminescent material particles and the third luminescent material particles in the luminescence conversion element is selected such that the mixed radiation consisting of the primary radiation emitted by the at least one optoelectronic semiconductor chip and secondary radiation generated by the luminescence conversion element has a predefinable color temperature.

We also further provide a luminescence conversion element for wavelength conversion of primary electromagnetic radiation into secondary electromagnetic radiation, including first luminescent material particles that, when excited by the primary electromagnetic radiation, emit a first electromagnetic radiation, a peak wavelength of which lies in a green region of the electromagnetic spectrum; second luminescent material particles that, when excited by the primary electromagnetic radiation, emit a second electromagnetic radiation, a peak wavelength of which lies in a yellow-red region of the electromagnetic spectrum; and third luminescent material particles that, when excited by the primary electromagnetic radiation, emit a third electromagnetic radiation, a peak wavelength of which lies in a red region of the electromagnetic spectrum, wherein the peak wavelength of the primary radiation lies in a blue region of the electromagnetic spectrum, the luminescence conversion element, when excited energetically by the primary radiation, emits secondary radiation containing the first, second and third radiation, and a correlated color temperature of a mixed radiation consisting of portions of the primary radiation and the secondary radiation, corresponds to a color temperature of white light.

DETAILED DESCRIPTION

We provide a luminescence conversion element for wavelength conversion of primary electromagnetic radiation into secondary electromagnetic radiation. The primary radiation may, for example, be electromagnetic radiation emitted by a light-emitting diode chip or a laser diode chip. The secondary radiation is lower energy electromagnetic radiation compared to the primary radiation. Primary and secondary radiation differ, for example, regarding the associated light color.

The luminescence conversion element may comprise luminescent material particles of at least one first type that, when excited by the electromagnetic primary radiation, emit a first electromagnetic radiation, the peak wavelength of which lies in the green region of the electromagnetic spectrum. Peak wavelength is used here and hereinafter to mean a wavelength at which the spectral intensity distribution, i.e., the intensity distribution as a function of wavelength, of the respective electromagnetic radiation displays an intensity maximum. It may also be the sole intensity maximum of the spectral intensity distribution. The spectral intensity distribution may, however, also have secondary maxima. In particular, the spectral intensity distribution has a global maximum at peak wavelength.

The peak wavelength of the first electromagnetic radiation may, for example, be at least 515 nm to at most 550 nm. The peak wavelength of the first electromagnetic radiation accordingly lies in a wavelength range in which the spectral sensitivity of the human eye is particularly sensitive. In other words, the "eye sensitivity curve" (also: V(λ) curve) in daylight has a value of at least 0.60 in the peak wavelength range of the first electromagnetic radiation.

The luminescence conversion element may comprise luminescent material particles of at least one second type that, when excited by the electromagnetic primary radiation, emit a second electromagnetic radiation, the peak wavelength of which lies in the yellow-red region of the electromagnetic spectrum. The peak wavelength of the second electromagnetic radiation may, for example, have a wavelength of at least 595 nm, preferably at least 600 nm, to at most 635 nm. The second electromagnetic radiation is thus lower energy than the first electromagnetic radiation.

The stated peak wavelength of the electromagnetic radiation emitted by the luminescent material particles is always provided with a measurement-related inaccuracy of up to 5 nm or of up to 10 nm. This inaccuracy is sometimes the result of the fact that the intensity distribution of the radiations emitted by the luminescent material particles of one type may be dependent on the weight and/or volume concentration of this type of luminescent material particles in the luminescence conversion element. The peak wavelength of the emitted radiation may thereby vary up- or downwards by up to 10 nm.

The luminescence conversion element may comprise luminescent material particles of at least one third type that, when excited by the electromagnetic primary radiation, emit a third electromagnetic radiation, the peak wavelength of which lies in the red region of the electromagnetic spectrum. The peak wavelength of the third electromagnetic radiation may, for example, be at least 625 nm to at most 660 nm, preferably at least 635 nm to at most 660 nm. The third electromagnetic radiation is in particular lower energy than the first and second electromagnetic radiation.

The peak wavelength of the electromagnetic radiation of the first, second and third types may, for example, be modified by way of the material composition of the luminescent material particles and/or the concentration proportions or proportions by weight of the luminescent material particles in the luminescence conversion element. It is also possible to vary the size and/or the shape of the luminescent material particles to modify the scattering properties. An increase in the concentration and/or number of one type of luminescent material particle in the luminescence conversion element may, for example, result in electromagnetic radiation that has already been converted being converted once again by luminescent material particles of one of the three types. A higher number of luminescent material particles of one type in the luminescence conversion element may thus result in the peak wavelength of the electromagnetic radiation emitted by luminescent material particles of this type being shifted to higher wavelengths.

The number of luminescent material particles of the first type, second type and third type in the luminescence conversion element may vary. Preferably, a multiplicity of luminescent material particles of each of the three types are contained in the luminescence conversion element.

The peak wavelength of the primary radiation may lie in the blue region of the electromagnetic spectrum. The peak wavelength of the primary radiation may, for example, be at least 425 nm to at most 460 nm, preferably at least 435 nm to 455 nm, and particularly preferably at least 440 nm to 450 nm. The primary radiation is accordingly of a higher energy than the first, second and third electromagnetic radiation.

When energetically excited by the primary radiation, the element may emit a secondary radiation containing the first, second and third radiation. The luminescence conversion element thus converts the primary radiation into secondary radiation, which is a superimposition of green, yellow-red and red converted radiation. The secondary radiation may comprise only the above-stated colors, i.e., the secondary radiation comprises only radiation components in the green to red region of the electromagnetic spectrum. However, the secondary radiation may also contain further color components such as, for example, blue light.

The correlated color temperature of mixed radiation consisting of portions of the primary radiation and the secondary radiation may correspond to the color temperature of white light, preferably of warm white or neutral white light. This corresponds to a color temperature of at least 2400 K to at most 8000 K, preferably to at most 5000 K. The mixed radiation is composed of portions of the primary radiation, portions of the first electromagnetic radiation, portions of the second electromagnetic radiation and portions of the third electromagnetic radiation. The designation "portion of a radiation" means either a portion of the emitted intensity of the radiation or the entire emitted intensity of the radiation. The correlated color temperature is the temperature of a black body radiator, the luminous effect of which, at identical brightness, is most similar to that of the mixed radiation.

The element may comprise luminescent material particles of at least one first type that, when excited by the electromagnetic primary radiation, emit a first electromagnetic radiation, the peak wavelength of which lies in the green region of the electromagnetic spectrum, luminescent material particles of at least one second type which, when excited by the electromagnetic primary radiation, emit a second electromagnetic radiation, the peak wavelength of which lies in the yellow-red region of the electromagnetic spectrum, and luminescent material particles of at least one third type that, when excited by the electromagnetic primary radiation, emit a third electromagnetic radiation, the peak wavelength of which lies in the red region of the electromagnetic spectrum, wherein the peak wavelength of the primary radiation lies in the blue region of the electromagnetic spectrum, the luminescence conversion element, when energetically excited by the primary radiation, emits secondary radiation containing the first, second and third radiation, and the correlated color temperature of mixed radiation consisting of portions of the primary radiation and the secondary radiation corresponds to the color temperature of white light, preferably of warm white or neutral white light.

With the luminescence conversion element described here, the concept is in particular followed that the use of luminescent material particles of at least three types opens up a new color degree of freedom compared with the use of luminescent material particles of just two types, allowing spectral optimization of the mixed radiation. Thus, a wide range of correlated color temperatures can be opened up merely by changing the concentration of the luminescent material particles and/or of the chemical and/or physical composition thereof. The use of two luminescent material particles that emit red and yellow-red electromagnetic radiation respectively opens up a new degree of freedom in the long wavelength range of the electromagnetic spectrum. This allows efficient generation of white light with a high color rendering index. In particular, warm white and neutral white light may here be produced with a high color rendering index.

The luminescence conversion element may exclusively contain luminescent material particles that, when excited by the primary radiation, emit the first, second and third electromagnetic radiation. The luminescence conversion element may thus, for example, be formed such that exclusively luminescent material particles of the first, second and third types and no further types of luminescent material particles are present in the same. However, radiation-scattering particles may, for example, be present that do not have any converting effect for the primary radiation and/or the converted electromagnetic radiations. Radiation scattering here in particular means Mie scattering. Furthermore, the luminescence conversion element may be formed solely from luminescent material particles that, when excited by the primary radiation, emit the first, second and third electromagnetic radiation. The luminescence conversion element may, for example, consist of only the luminescent material particles of the three types. The luminescence conversion element may then consist, for example, only of ceramic luminescent materials. It is, however, also possible for the luminescence conversion element to contain or consist of luminescent material particles of more than three types, wherein the different types of luminescent material particles emit only the first, second and third electromagnetic radiation when excited by the primary radiation.

The peak wavelength of the first electromagnetic radiation and the peak wavelength of the second electromagnetic radiation may differ by at least 20 nm and at most 100 nm. The two peak wavelengths particularly preferably differ by at least 50 nm and at most 90 nm. In other words, the first and second electromagnetic radiations are clearly distinguishable in color.

The peak wavelength of the second electromagnetic radiation and the peak wavelength of the third electromagnetic radiation may differ by at least 2 nm and at most 60 nm. Preferably, the peak wavelengths of the two types of radiation differ by at least 20 nm, particularly preferably by at least 25 nm, and at most 50 nm. In other words, the second and third electromagnetic radiations are of a similar color. The second and third electromagnetic radiations may preferably not be of the same color. For example, the second electromagnetic radiation lies in the yellow-red to orange spectral region, while the third electromagnetic radiation may lie in the red to deep red spectral region.

The peak wavelength of the second electromagnetic radiation is at least 595 nm, preferably at least 600 nm, and at most 612 nm.

The luminescent material particles of the first type may be formed with a garnet-based wavelength conversion material, for example, with $(Y,Lu,Gd,Tb,Ce)_3(Al,Ga)_5O_{12}$. The luminescent material particles of the first type are preferably formed with a wavelength conversion material of lutetium yttrium aluminum garnet and/or lutetium yttrium aluminum gallium garnet $((Y,Lu,Ce)_3(Al,Ga)_5O_{12}))$ and particularly preferably with cerium-doped lutetium aluminum garnet and/or with cerium-doped lutetium aluminum gallium garnet $((Lu,Ce)_3(Al,Ga)_5O_{12})$.

The statement of a chemical empirical formula should always be understood to be a generalized empirical formula. The material of the luminescent material particles may thus contain further chemical elements not stated in the empirical formula, in low concentration, providing these further chemical elements have substantially no influence on the peak wavelength of the radiation emitted by the luminescent material particles. Impurities may, for example, occur during synthesis of the chemical compounds, which do not, however, substantially influence the converted wavelength, i.e., within a measuring tolerance.

The peak wavelength of the first electromagnetic radiation emitted by the luminescent material particles may be influenced by modifying the percentage proportions of the chemical constituents. For example, 2.2% or 2.5% of the lutetium atoms may be replaced by cerium atoms within the bounds of manufacturing tolerances. An increase in the content of cerium atoms in the garnet luminescent material with a simultaneous reduction in lutetium content leads to an increase in the peak wavelength of the first electromagnetic radiation. The lutetium aluminum garnet may furthermore be doped with gallium. For example, 25% of the aluminum atoms may be replaced by gallium atoms within the bounds of manufacturing tolerances.

The luminescent material particles of the second type may be formed with a nitridosilicate-based wavelength conversion material, preferably with $(Sr,Ba,Ca,Mg)_2Si_5N_8$:Eu. Furthermore, the luminescent material particles of the third type may be formed with a nitride-based wavelength conversion element, preferably with $(Sr,Ca)AlSiN_3$:Eu. As before in the first electromagnetic radiation, the peak wavelength of the second and third electromagnetic radiations may be modified by way of the percentage ratios of the chemical constituents of the material used.

The luminescent material particles of the at least three different types may each consist of different materials. For example, the chemical compositions of the luminescent material particles of the first, second and third types may be different. "Different chemical composition" means that the materials used cannot be described with the same chemical empirical formula and/or structural formula. It is, however, also possible for the luminescent material particles to be built up from the same elements, but the percentage proportion of the constituents contained in the chemical compound used may be modified and/or doping atoms may be added or omitted.

The luminescent material particles of at least two of the at least three different types of luminescent material particles may consist of the same material, i.e., the chemical composition of the two types of luminescent material particles is identical, and have different average particle sizes. The different average particle sizes may, for example, modify the scattering behavior of the luminescent material particles and/or the conversion efficiency, for which reason the mixed radiation emitted on energetic excitation by the primary radiation has a different wavelength range, i.e., a different color temperature.

To determine the particle sizes, the d50 value, measured in $Q_3$, is used, for example. A d50 value means the median diameter determined using cumulative distribution of the particles. "$Q_3$" denotes cumulative mass distribution or cumulative volume distribution. It is, however, also possible for the particle sizes to be subject to random distribution and for the particle size to indicate a mean and/or a probable value of this distribution.

The color rendering index of the mixed radiation consisting of the primary radiation and the secondary radiation may have a value of at least 80, preferably of at least 90. The color rendering index indicates the quality of the color rendering of a light source compared with a black body radiator of the same correlated color temperature. It is accordingly possible to produce with the luminescence conversion element a mixed radiation exhibiting high quality color rendering. In particular, this high color rendering index may be achieved for all the color temperatures of the mixed radiation that can be generated.

The color rendering index of the mixed radiation may have a value of at least 80 and at most 90 and the concentration proportion of the luminescent material particles of the second and third types relative to the concentration of the luminescent material particles of the first type in the luminescence conversion element may be selected such that the concentration proportion of the luminescent material particles of the second type amounts to at least 2% to at most 13% and the concentration proportion of the luminescent material particles of the third type amounts to at least 1% to at most 20% of the concentration of the luminescent material particles of the first type in the luminescence conversion element. The concentration proportion or the concentration of a luminescent material particle indicates the concentration proportion by weight or the weight concentration.

An increase in the concentration proportion of the luminescent material particles of the third type may thus lead to an increase in the color rendering index while the color temperature remains constant. For a constant color temperature, the minimum requirement of the color rendering index determines the necessary proportion of luminescent material particles of the third type in relation to the luminescent material particles of the second type. Ideally, only as many luminescent material particles of the third type are used as are needed to achieve the required color rendering index. Therefore, the proportion of luminescent material particles of the third type is always greater for a solution with a high color rendering index of 90 than for a solution with a lower color rendering index with the same color temperature of the mixed radiation generated.

An increase in the cumulative concentration proportion of the luminescent material particles of the second and third types may thus lead, for example, to a reduction in the color temperature. For a low color temperature, proportionally more luminescent material particles of the second and third types are thus needed than for a high color temperature. The cumulative concentration proportion of the luminescent material particles of the second and third types may, for the generation of mixed radiation with a color temperature of 2700 K, be at least 19% to at most 22%. To generate mixed radiation with a color temperature of 5000 K, the cumulative concentration proportion of the luminescent material particles of the second and third types may be at least 14% to at most 15%.

The concentration ratios of the luminescent material particles relative to one another required to achieve a color temperature and/or a specific color rendering index may be substantially independent of the total number of luminescent material particles and/or of the cumulative concentration of the luminescent material particles of all three types in the luminescence conversion element. This means that, when the same materials are used for the three types of luminescent material particles, the concentration ratios to achieve the same color temperature and/or the same color rendering index in a luminescence conversion element taking the form of volume encapsulation may be more or less the same as in a thin-film luminescence conversion element.

In a thin-film luminescence conversion element, the luminescent material particles are arranged in a layer having a uniform thickness within the bounds of manufacturing tolerances. The thin-film luminescence conversion element may consist of the luminescent material particles and in particular be free of a matrix material.

In a luminescence conversion element taking the form of volume encapsulation, the luminescent material particles are arranged in a matrix material. For example, the luminescent material particles may be present as a powder. The volume encapsulation may in particular have a non-uniform thickness.

It is, moreover, possible for the luminescence conversion element to comprise a thin film and volume encapsulation. The thin film and the volume encapsulation may then contain luminescent material particles of at least one of the three types or consist thereof. The volume encapsulation is, for example, arranged downstream of the thin film and the thin film contains luminescent material particles of the first type and the volume encapsulation contains luminescent material particles of the second and third types such that the first electromagnetic radiation emitted by the luminescent material particles of the first type may be reconverted by the luminescent material particles of second and third types.

We additionally provide an optoelectronic semiconductor component. The optoelectronic semiconductor component comprises a luminescence conversion element described herein. That is to say, all the features disclosed for the luminescence conversion element are also disclosed for the optoelectronic semiconductor component and vice versa.

The optoelectronic semiconductor component may comprise a luminescence conversion element and at least one optoelectronic semiconductor chip. The optoelectronic semiconductor chip emits the primary radiation when in operation.

The luminescence conversion element may be arranged downstream of the optoelectronic semiconductor chip such that at least a portion of the primary radiation emitted by the at least one optoelectronic semiconductor chip enters the luminescence conversion element. The luminescence conversion element may be in direct physical contact with the optoelectronic semiconductor chip. However, there may also be an interspace between the optoelectronic semiconductor chip and the luminescence conversion element, containing gas and/or another material that is radiation-transmissive. The optoelectronic semiconductor component emits a mixed radiation formed from portions of the primary radiation emitted by the optoelectronic semiconductor chip and of the secondary radiation generated by the luminescence conversion element. In other words, the optoelectronic semiconductor component emits white light.

The luminescence conversion element may cover a radiation exit face of the at least one optoelectronic semiconductor chip at least in places. The radiation exit face of the at least one optoelectronic semiconductor chip may accordingly be completely covered by the luminescence conversion element, but it is also possible for the optoelectronic semiconductor chip to be free of the luminescence conversion element in places. The free points may either be filled with gas or covered with another material that is not the luminescence conversion element. The luminescence conversion element may thus be an encapsulation body or a layer.

It is possible for portions of the primary radiation to pass through the luminescence conversion element without being converted. Furthermore, it is possible for the luminescence conversion element to be such that "full" conversion takes place of the primary radiation entering the luminescence conversion element. This means that all the primary radiation entering the luminescence conversion element is converted into secondary radiation. The radiation emitted by the luminescence conversion element in this case does not contain any primary radiation or no primary radiation is detectable within the bounds of measuring accuracy. To provide the mixed radiation in a full conversion, the radiation exit face of the at least one optoelectronic semiconductor chip may, for example, be free in places from the luminescence conversion element, such that at these free points the primary radiation may be emitted, enabling mixing with the secondary radiation. It is, however, also possible for the optoelectronic semiconductor component to comprise at least one second optoelectronic semiconductor chip, which likewise emits primary radiation, wherein the luminescence conversion element is arranged downstream of the at least two optoelectronic semiconductor chips such that the primary radiation emitted by the second optoelectronic semiconductor chip is not converted or converted only in part and may be combined with the secondary radiation emitted by the luminescence conversion element such that overall the optoelectronic semiconductor component emits the mixed radiation.

The luminous efficacy of the optoelectronic semiconductor component is greater than that of an optoelectronic semiconductor component of otherwise identical construction having the same color rendering index, but contains a luminescence conversion element containing fewer than three different types of luminescent material particles. In an optoelectronic semiconductor component of otherwise identical construction, it is thus also possible to achieve a high color rendering index, but with a lower achievable luminous efficacy.

The luminous efficacy (or luminous efficacy of radiation, LER) of the mixed radiation is here a measure of the quality of the mixed radiation and expresses the proportion of the spectrum of the generated mixed radiation useful for the human eye in the unit lumens per watt of emitted mixed radiation. A high luminous efficacy is achieved when the largest possible proportion of mixed radiation is generated in the spectral region in which the sensitivity of the human eye is high. In the red spectral region the eye sensitivity curve drops away towards long wavelengths, for which reason the use of a shorter wavelength second electromagnetic radiation is particularly advantageous.

Furthermore, the efficiency of the optoelectronic semiconductor component may also be increased compared to an optoelectronic semiconductor component of otherwise identical construction having the same color rendering index, but contains a luminescence conversion element containing fewer than three different types of luminescent material particles. Efficiency expresses the luminous efficacy of the optoelectronic semiconductor component in relation to the primary radiation irradiated into the luminescence conversion element in the unit lumens per watt. Efficiency thus then corresponds to the conversion efficiency of the luminescence conversion element.

An optoelectronic semiconductor component of otherwise identical construction, in which only two different types of luminescent material particles are used, is thus associated with the problem that either a lower color rendering index is achieved or, if a high color rendering index is achieved, conversion is performed into wavelength ranges which cannot be or can barely be perceived by the eye. The luminous efficacy of a semiconductor component with three types of luminescent material particles may be increased by, for example, 4.4% compared to the luminous efficacy of a semiconductor component of otherwise identical construction with two types of luminescent material particles.

Furthermore, a method is provided to produce an optoelectronic semiconductor component described herein that emits white light. In other words, all the features disclosed for the optoelectronic semiconductor component are also disclosed for the production method and vice versa.

First, a luminescence conversion element described herein may be provided, wherein the respective concentration of luminescent material particles of the first type, second type and third type in the luminescence conversion element is selected such that the mixed radiation consisting of the primary radiation emitted by the at least one optoelectronic semiconductor chip and the secondary radiation generated by the luminescence conversion element has the predefinable color temperature.

The correlated color temperature of the mixed radiation may thus be modified during production without modifying the material of the luminescent material particles. For example, the color temperature may be predefined during production of the luminescence conversion element by way of the concentration ratios of the three types of luminescent material particles relative to one another. The correlated color temperature of the mixed radiation may be, for example, at least 2400 K to at most 8000 K, preferably to at most 5000 K.

The color temperature of the mixed radiation may, for example, be modified as follows. For a low color temperature, i.e., warmer light, the concentration and/or the number of luminescent material particles of the second and/or third type in the luminescence conversion element is increased compared to the concentration and/or number of luminescent material particles of the first type. In other words, for warm white light a higher red content is required in the secondary radiation. Conversely, for a higher color temperature, the red content is reduced and the concentration and/or number of luminescent material particles of the first type is increased.

In addition, it is possible for the desired color temperature and the desired color rendering index of the mixed radiation to be adjustable during production. For example, a predefined concentration and/or number of luminescent material particles of the first type may be introduced into the material of the luminescence conversion element. The predefined color temperature may then be adjusted substantially by the choice of concentration and/or number of luminescent material particles of the second type. The predefined color rendering index may be adjusted substantially by the choice of concentration and/or number of luminescent material particles of the third type.

It is for instance possible for a luminescence conversion element with a color rendering index of greater than 90 to have a higher concentration and/or a higher number of luminescent material particles of the third type compared with the concentration and/or number of luminescent material particles of the second type than a luminescence conversion element likewise with a color rendering index of at least 80 and at most 90. Furthermore, it is possible for a luminescence conversion element that generates mixed radiation with a first color temperature, to have a higher concentration and/or a higher number of luminescent material particles of the first type compared with the concentration and/or number of luminescent material particles of the second and/or third type than a luminescence conversion element that generates mixed radiation with a second color temperature lower than the first color temperature.

The luminescence conversion element and the optoelectronic semiconductor component are explained in greater detail below with reference to examples and the associated figures.

Identical, similar or identically acting elements are provided with the same reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

Figure 1A:
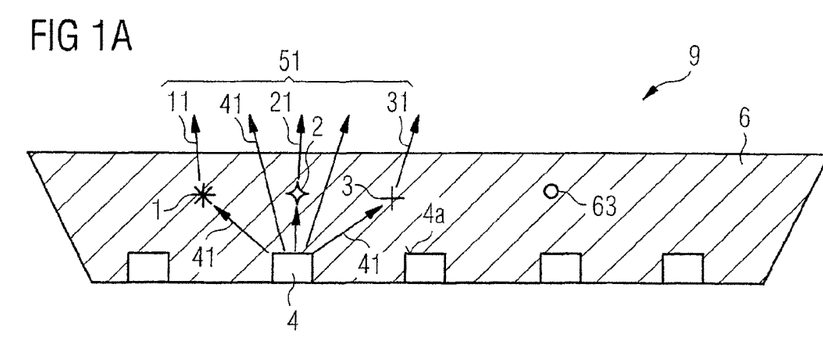
FIGS. 1A, 1B and 1C show examples of an optoelectronic semiconductor component.
Figure 1B:
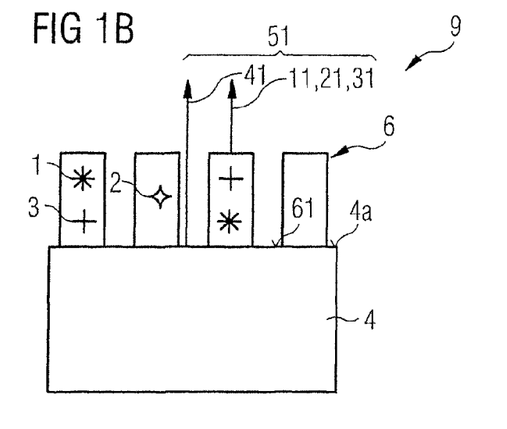
Figure 1C:
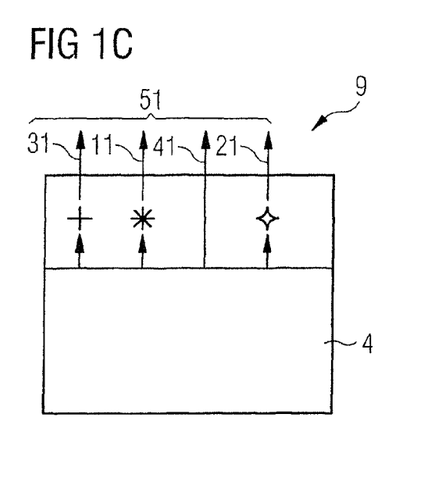

Examples of the optoelectronic semiconductor component 9 described here are explained in greater detail with reference to the schematic sectional representations of FIGS. 1A, 1B and 1C. FIG. 1A shows a first example of an optoelectronic semiconductor component 9. The optoelectronic semiconductor component 9 comprises a luminescence conversion element 6 and an optoelectronic semiconductor chip 4 with a radiation exit face 4a. The optoelectronic semiconductor chip 4 emits a primary radiation 41. The peak wavelength 4p of the primary radiation 41 lies in the blue region of the electromagnetic spectrum.

The luminescence conversion element 6 is arranged downstream of the radiation exit face 4a of the optoelectronic semiconductor chip 4 such that the primary radiation 41 may enter the luminescence conversion element 6. To this end, the luminescence conversion element 6 may be in direct contact with the radiation exit face 4a of the optoelectronic semiconductor chip 4. At variance with FIG. 1A, however, it is also possible for there to be a radiation-transmissive material or a gas-filled interspace between the radiation exit face 4a and the luminescence conversion element 6.

The luminescence conversion element 6 comprises at least three types of luminescent material particles 1, 2, 3. In this case, when excited energetically by the primary radiation 41, each type of luminescent material particles 1, 2, 3 emits an electromagnetic radiation 11, 21, 31 having a higher peak wavelength 1p, 2p, 3p than the peak wavelength 4p of the primary radiation 41. For instance, when excited by the primary radiation 41, the luminescent material particles of the first type 1 emit a first electromagnetic radiation 11, the peak wavelength 1p of which lies in the green region of the electromagnetic spectrum. When excited energetically by the primary radiation 41, the luminescent material particles of the second type 2 emit a second electromagnetic radiation 21, the peak wavelength 2p of which lies in the yellow-red region of the electromagnetic spectrum. When excited energetically by the primary radiation 41, the luminescent material particles of the third type emit a third electromagnetic radiation 31, the peak wavelength 3p of which lies in the red region of the electromagnetic spectrum. The mixed radiation 51 consisting of portions of the primary radiation 41, the first electromagnetic radiation 11, the second electromagnetic radiation 21 and the third electromagnetic radiation 31 is white.

In the example shown here, the luminescence conversion element 6 takes the form of an encapsulation body. This means that the luminescence conversion element 6 is formed, for example, with a matrix material containing silicone, epoxy resin or another transparent material. The matrix material contains the luminescent material particles of the first, second and third types 1, 2, 3. Furthermore, the luminescence conversion element may contain other scattering particles 63 that do not convert the primary radiation 41.

A further example of an optoelectronic semiconductor component 9 is explained in greater detail with reference to the schematic sectional representation of FIG. 1B. In this example, the luminescence conversion element 6 is a thin film applied directly to the radiation exit face 4a of the optoelectronic semiconductor chip 4. The radiation exit face 4a of the optoelectronic semiconductor chip 4 may in places remain free of the luminescence conversion element 6. At these free points 61 the primary radiation 41 may be freely emitted. The free points 61 may, however, also be covered by a radiation-opaque material.

The luminescence conversion element 6 in the form of a thin film may contain further materials in addition to the at least three types of luminescent material particles 1, 2, 3, but the luminescence conversion element 6 may also consist of just the three types of luminescent material particles 1, 2, 3. In the latter case, the luminescence conversion element 6 may, for example, be deposited onto the radiation exit face 4a of the optoelectronic semiconductor chip 4 using an electrophoresis process.

It is additionally possible for the luminescent material particles (1, 2, 3) to be sintered, i.e., fired, to yield a ceramic plate that is then applied to the radiation exit face 4a of the optoelectronic semiconductor chip 4. In this case, no or barely any scattering of the radiation, for example, then takes place, but rather the primary radiation is merely absorbed by the luminescent material particles (1, 2, 3) and then the converted electromagnetic radiation of the first, second and third types (11, 21, 31) is emitted by the luminescent material particles.

A further example of an optoelectronic semiconductor component 9 described here is explained in greater detail with reference to the schematic sectional representation of FIG. 1C. The radiation exit face 4a of the optoelectronic semiconductor chip 4 is completely covered by the luminescence conversion element 6 in the form of a thin film and is in direct contact therewith.

Figure 2:
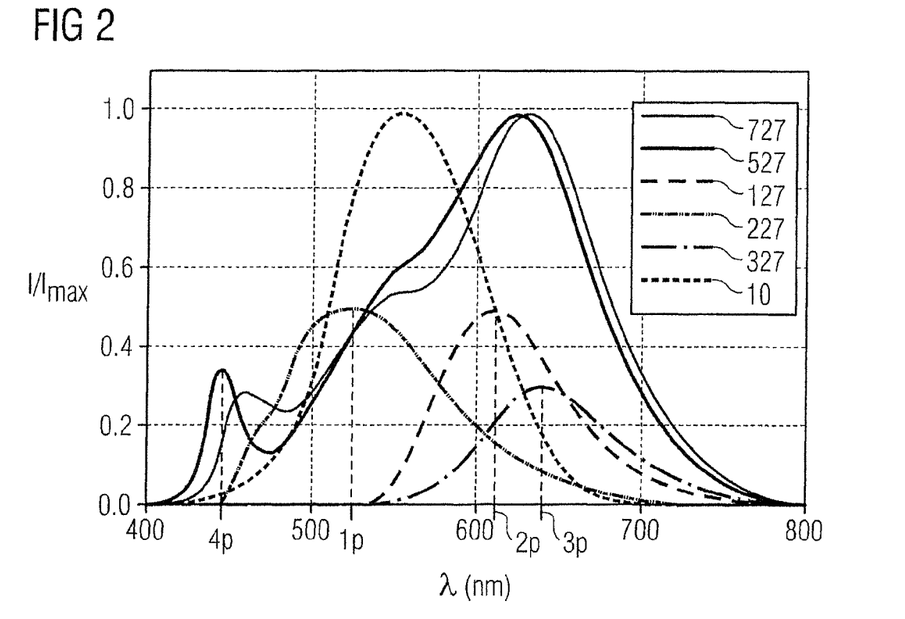
FIG. 2 shows spectral intensity distributions of the primary radiation, of the first, second and third electromagnetic radiation and the mixed radiation of an example of a luminescence conversion element.

FIG. 2 shows simulated spectral intensity distributions 127, 227, 327, 527 of the electromagnetic radiations 11, 21, 31, 41 emitted by examples of the luminescent material particles and/or an example of an optoelectronic semiconductor component 9. The spectral intensity distribution of the mixed radiation 527 was normalized to the maximum intensity $I_{max}$ of the mixed radiation 51. The intensity distributions 127, 227, 327 of the electromagnetic radiations emitted by the luminescent material particles are plotted in arbitrary units.

The spectral intensity distribution illustrated in FIG. 2 or the spectrum illustrated of the mixed radiation 527 corresponds to a correlated color temperature of 2700 K with a color rendering index of 90. The spectrum of the first electromagnetic radiation 127, the spectrum of the second electromagnetic radiation 227 and the spectrum of the third electromagnetic radiation 327 were selected in accordance with this color temperature to be achieved and with the color rendering index to be achieved. The spectrum of the mixed radiation 527 may be made up of the spectra of the three converted electromagnetic radiations 127, 227, 327. It is, however, also possible for portions of the spectra of the three converted electromagnetic radiations 127, 227, 327 not to be contained in the spectrum of the mixed radiation since additional conversion may, for example, take place. In particular, it is possible for the higher energy components of the first electromagnetic radiation 11 to be reconverted by the luminescent material particles of the second and third types 2, 3 and thus not to be contained in the spectrum of the mixed radiation 527. In addition, the spectrum of the mixed radiation 527 comprises a component of the primary radiation 41, the peak wavelength 4p of which forms the secondary maximum of the spectrum 527 in the range of 440 nm to 450 nm.

Furthermore, FIG. 2 shows the spectral eye sensitivity curve 10 in daylight and the spectrum of the mixed radiation 727 emitted by an optoelectronic semiconductor component otherwise of identical construction, but only containing the first and third types of luminescent material particles.

The eye sensitivity curve 10 has a high value, in particular a value of above 0.60, in the green region of the electromagnetic spectrum, i.e., at a wavelength of around 515 nm to 570 nm. The peak wavelength 1p of the first electromagnetic radiation 11 lies in this region of the electromagnetic spectrum, at around 515 nm to 550 nm. The peak wavelength 2p of the second electromagnetic radiation 21 lies in the yellow-red region of the electromagnetic radiation, at around 595 to 625 nm. The peak wavelength 3p of the third electromagnetic radiation 31 lies in the long wavelength red region of the spectrum, at around 625 nm to 660 nm.

The advantage of using three types of luminescent material particles 1, 2, 3 compared to using just two types of luminescent material particles 1, 3 is apparent from a comparison of the spectra of the respective mixed radiation 527, 727. In particular in the green-yellow region of the electromagnetic spectrum, i.e., at a wavelength of around 540 to 620 nm, an increase may be noted in the intensity distribution 527 of the mixed radiation 51 emitted by an optoelectronic semiconductor component 9 compared to the intensity distribution 727 of the mixed radiation emitted by an optoelectronic semiconductor component of otherwise identical construction but containing only the first and third types of luminescent material particles. This increase is a consequence of the use of the second type of luminescent material particles 2. The spectrum of the mixed radiation 727 thus contains a higher proportion from the green-yellow wavelength range, at which the eye sensitivity curve 10 has a higher value. This makes it possible to achieve high luminous efficacy with the optoelectronic semiconductor component 9.

Figure 3:
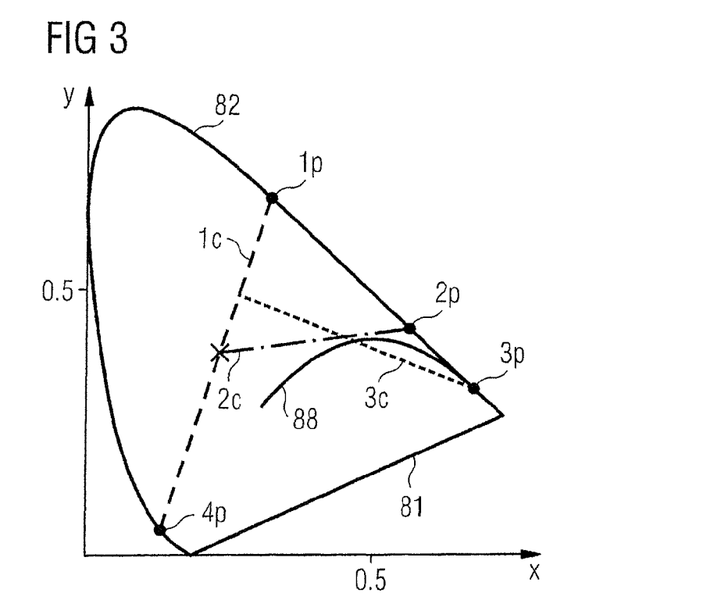
FIG. 3 shows a highly simplified outline of the CIE standard chromaticity diagram that explains the mode of operation of luminescence conversion element 6.

FIG. 3 shows the color space that may be opened up with the mixed radiation 51 emitted by the optoelectronic semiconductor component 9 on the basis of the "CIE standard chromaticity diagram" 8. FIG. 3 explains the mode of operation of a luminescence conversion element 6 and should be understood to be a highly simplified representation. The relative green content y is plotted against the relative red content x. The relative blue content z results from the mathematical relationship x+y+z=1. The CIE-standard chromaticity diagram 8 comprises all the colors perceptible to the human eye in the color space (x, y, z), wherein 0<x<1, 0<y<1 and 0<z<1.

The spectrum locus 82 contains the spectrally pure colors, while the line of purples 81 joins the two outermost points of the spectrum locus 82. The black body curve 88 indicates the position of the color values achievable with a black body radiator in the standard chromaticity diagram 8. The black body curve 88 has higher temperatures in the left-hand region of the standard chromaticity diagram 8, i.e., with a lower red content, than in the right-hand region of the standard chromaticity diagram 8.

The peak wavelength of the primary radiation 4p lies in the blue region of the electromagnetic spectrum and may be found on the spectrum locus 82 at low x- and y-values. The peak wavelengths of the luminescent material particles of the first, second and third types 1p, 2p, 3p lie on the side of the standard chromaticity diagram 8 opposite the blue region in the green to red region of the electromagnetic spectrum.

A reduction in the concentration proportion of the luminescent material particles of the first type 1 leads to a reduction in the green content of the mixed radiation 51 along the concentration line 1c. A reduction in the concentration proportions of the luminescent material particles of the second type 2 or of the third type 3 likewise leads to a reduction in the yellow-red or the red content respectively of the mixed radiation 51 along the concentration line 2c or 3c respectively. The achievable color space of the mixed radiation 51 is opened up by the concentration lines of the luminescent material particles of the second and third types 2c, 3c and the spectrum locus 82 and/or the concentration line of the luminescent material particles of the first type 1c. Thus, the use of three different types of luminescent material particles results in a wide variety of spectra of the same color of predefinable color temperature.

The concentration proportions of the luminescent material particles of the second and third types 2c, 3c in the luminescence conversion element 6, relative to the concentration of the luminescent material particles of the first type 1c may, for example, be selected as follows: for the generation of warm white light with a color rendering index of 80 and a correlated color temperature of 2700 K it is, for example, possible to select concentration proportions 2c, 3c of 11% for the luminescent material particles of the second type 2 and of 8% for the luminescent material particles of the third type 3. To generate warm white light with a color rendering index of 90 and a correlated color temperature of around 2700 K, it is, for example, possible to select concentration proportions 2c, 3c of 2% for the luminescent material particles of the second type 2 and of 20% for the luminescent material particles of the third type 3. To generate neutral white light with a color rendering index of 80 and a correlated color temperature of around 5000 K, it is, for example, possible to select concentration proportions 2c, 3c of 13% for the luminescent material particles of the second type 2 and of 1% for the luminescent material particles of the third type 3. The same color temperature may be achieved with a color rendering index of 90 at concentration proportions 2c, 3c of 4% for the luminescent material particles of the second type 2 and of 11% for the luminescent material particles of the third type 3. The percentages here relate to the concentration 1c of the luminescent material particles of the first type 1.

The absolute concentrations are dependent on the example, in particular on the length of the radiation path of the primary radiation 51 in the luminescence conversion element 6, i.e., for example, on the thickness and/or size thereof. For example, to achieve a color temperature of 2700 K and a color rendering index of 80, the concentrations 1c, 2c, 3c in a volume encapsulation may amount to 22% for the luminescent material particles of the first type 1, to 2.5% for the luminescent material particles of the second type 2 and to 1.8% for the luminescent material particles of the third type 3. For a color temperature of 2700 K and a color rendering index of 90 the concentrations 1c, 2c, 3c may amount to 23%, 0.5% and 5.0%, for a color temperature of 5000 K and a color rendering index of 80 the concentrations 1c, 2c, 3c may amount to 16%, 2.0% and 0.2%, and for a color temperature of 5000 K and a color rendering index of 90 the concentrations 1c, 2c, 3c may amount to 16%, 0.6% and 2.0%. The first percentage indicates the concentration of the luminescent material particles of the first type 1c, the second percentage the concentration of the luminescent material particles of the second type 2c and the third percentage the concentration of the luminescent material particles of the third type 3c in the volume encapsulation.

The advantages of our optoelectronic semiconductor component are explained in greater detail with reference to the simulated color rendering index 5t, 7t illustrated in FIG. 4 and the efficiency 5e, 7e of the mixed radiation 51 emitted by an example of an optoelectronic semiconductor component 9. The diagram contains both the color rendering index $R_A$ (left axis) and the efficiency η (right axis) as a function of the color temperature CCT. Simulated values 5e, 5t are shown for an optoelectronic semiconductor component 9 and, for comparison, the simulated values 7e, 7t of an optoelectronic semiconductor component of otherwise identical construction which contains luminescent material particles of just two types.

Figure 4:
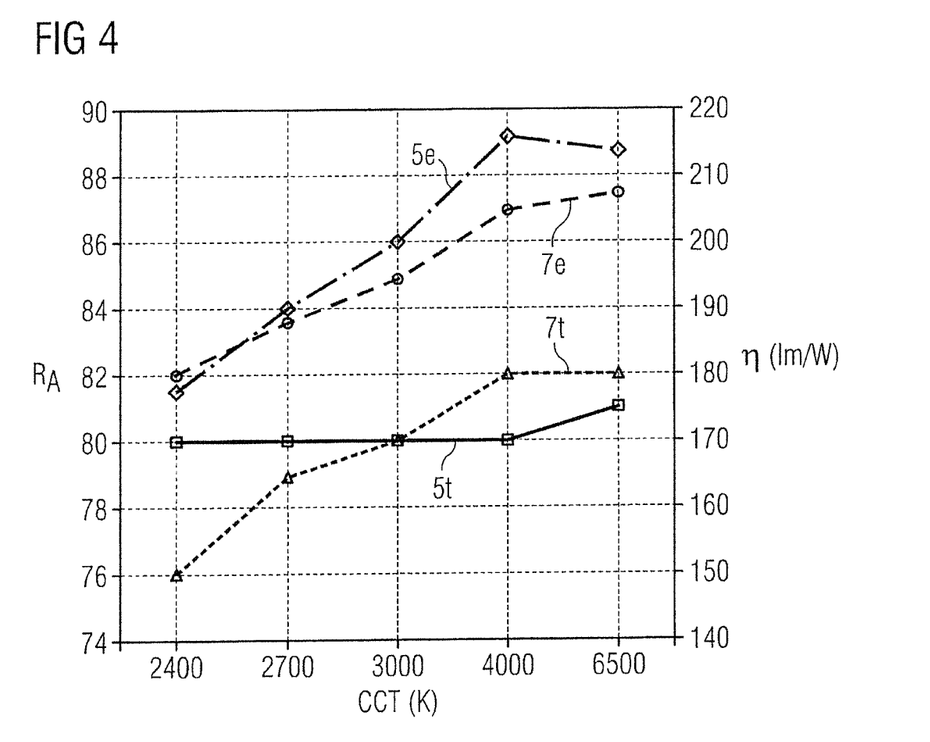
FIG. 4 shows the simulated efficiency of an example of an optoelectronic semiconductor component and the color rendering index of the mixed radiation generated with such an optoelectronic semiconductor component as a function of the color temperature of the mixed radiation.

In the lower region of the diagram illustrated in FIG. 4, the color rendering index 5t of the mixed radiation 51 emitted by the optoelectronic semiconductor component 9 and the color rendering index 7t of the mixed radiation emitted by an optoelectronic semiconductor component of otherwise identical construction which in the example shown here contains luminescent material particles of just the first and third types is plotted against the color temperature CCT. As is clear, it is possible with the optoelectronic semiconductor component 9 to achieve a higher color rendering index 5t of the mixed radiation 51 in particular in the warm white range of the spectrum, i.e., of around 2400 K to 3000 K.

In the upper region of the diagram shown in FIG. 4, the efficiency 5e of the optoelectronic semiconductor component 9 and the efficiency 7e of an optoelectronic semiconductor component of otherwise identical construction containing luminescent material particles of just the first and third types is plotted against the color temperature CCT. The efficiency 5e of the mixed radiation 51 of the optoelectronic semiconductor component 9 is greater at color temperatures of above around 2700 K than the efficiency 7e of an optoelectronic semiconductor component which contains luminescent material particles of just the first and third types.

To summarize, it is apparent from FIG. 4 that with an optoelectronic semiconductor component 9 a high efficiency 5e and/or a high color rendering index 7e of the generated mixed radiation 51 may be achieved.

Figure 5A:
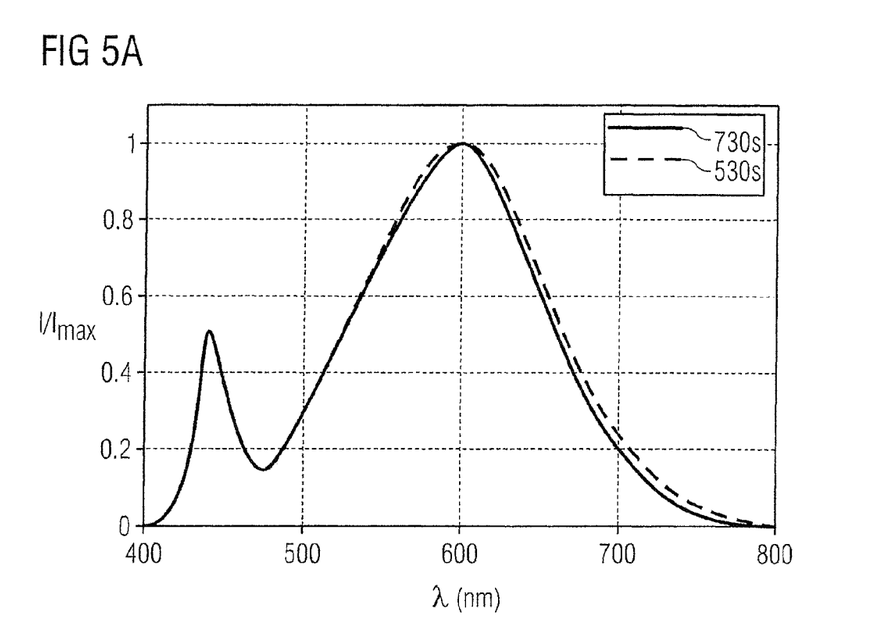
FIGS. 5A and 5B show simulated and measured spectral intensity distributions of the mixed radiation generated with an example of an optoelectronic semiconductor component.
Figure 5B:
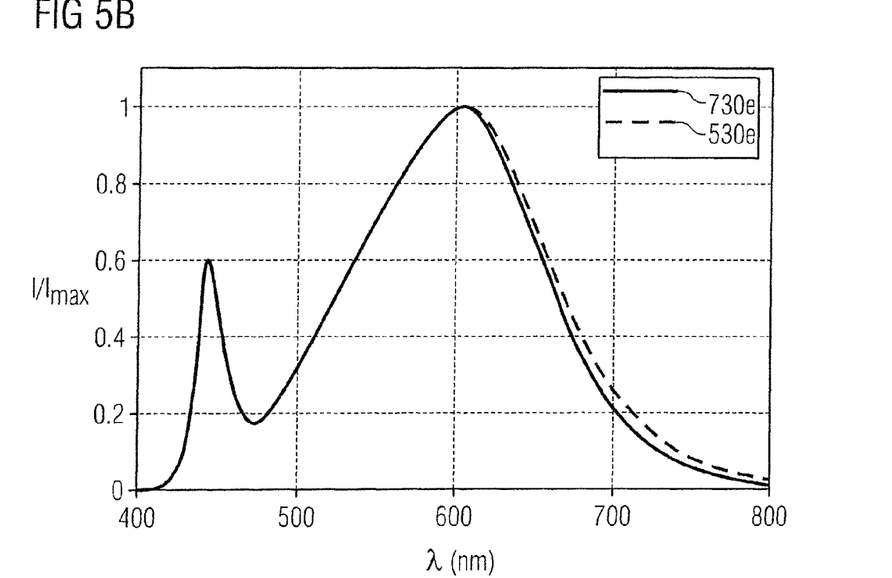

To explain the improved luminous efficacy of the optoelectronic semiconductor component 9, FIGS. 5A and 5B show normalized spectral intensity distributions 530s, 530e of the mixed radiation 51 emitted by an optoelectronic semiconductor component 9 described here, which mixed radiation has a color temperature of 3000 K and a simulated color rendering index of 80 (measured experimentally: 81.4), and normalized spectral intensity distributions 730s, 730e of the mixed radiation emitted by an optoelectronic semiconductor component of otherwise identical construction which contains luminescent material particles of just the first and third types, which mixed radiation has a color temperature of 3000 K and a simulated color rendering index of 80 (experimentally: 81.9).

FIG. 5A shows the intensity distributions 530s, 730s determined using numerical simulation and FIG. 5B shows the experimentally determined intensity distributions 530e, 730e.

For the simulations, a quantum efficiency of 98% was assumed for the luminescent material particles of the first type 1 and of 95% for the luminescent material particles of the second type 2 and third type 3. The quantum efficiency indicates the probability of a photon of the primary radiation impacting on a luminescent material particle being converted into a lower energy photon. Random fluctuations of the measured values in FIG. 5b are smaller than the magnitude of the data points due to the high measurement signal-to-noise ratio.

At small wavelengths, up to around 540 nm, no significant difference can be perceived between the two simulated intensity distributions 530s, 730s. At high wavelengths, from around 600 nm, the spectral intensity distribution of the optoelectronic semiconductor component with just two types of luminescent material particles 730s has a higher normalized intensity, however, than the spectral intensity distribution of an optoelectronic semiconductor component 530s described here. Since this region of the electromagnetic spectrum is only weakly perceptible or not perceptible at all to the human eye, the efficiency and luminous efficacy of the optoelectronic semiconductor component containing luminescent material particles of just the first and third types are lower than the efficiency and luminous efficacy of an optoelectronic semiconductor component 9.

In the wavelength range of around 540 nm to 600 nm, the simulated spectral intensity distribution 530s of the optoelectronic semiconductor component 9 is somewhat below the simulated spectral intensity distribution 730s of the optoelectronic semiconductor component with just two types of luminescent material particles. This reduction in intensity in a region of the spectrum in which the eye sensitivity curve 10 has a high value does not, however, reduce the simulated color rendering index.

The experimentally measured spectral intensity distributions 530e, 730e of FIG. 5b display a similar behavior to that of the simulated intensity distributions, with the sole difference that the experimentally measured distributions 530e, 730e at a wavelength of around 540 nm to 600 nm are barely distinguishable from one another and thus experimentally a better luminous efficacy and/or a better color rendering index may be achieved with the optoelectronic semiconductor component 9 even than was predicted by the simulations.

The efficiency and luminous efficacy may be determined from the integral over the spectral intensity distributions. The respective values for a mixed radiation with a color temperature of 3000 K and a color rendering index of around 80 are indicated below.

The simulated luminous efficacy of the optoelectronic semiconductor component 9 amounts to 321.8 lm/W (experimentally: 322.9 lm/W) and is thus 2.5% (experimentally: 3.0%) above the simulated luminous efficacy of 313.8 lm/W (experimentally: 313.5 lm/W) of the optoelectronic semiconductor component of otherwise identical construction which contains luminescent material particles of just the first and third types. The simulated efficiency of the optoelectronic semiconductor component 9 amounts to 200.3 lm/$W_{blue}$ (experimentally: 217.6 lm/$W_{blue}$) and is thus 2.9% (experimentally: 4.4%) above the simulated efficiency of 194.6 lm/$W_{blue}$ (experimentally: 208.5 lm/$W_{blue}$) of the optoelectronic semiconductor component of otherwise identical construction which contains luminescent material particles of just the first and third types. $W_{blue}$ here indicates the radiant power emitted by the optoelectronic semiconductor chip.

The luminescence conversion element 6 and the optoelectronic semiconductor component 9 are particularly efficient due to the selection of luminescent material particles of at least three types 1, 2, 3. With the mixed radiation 51 generated, a large color space may be opened up. Compared to a luminescence conversion element of otherwise identical construction or an optoelectronic semiconductor component 9 of otherwise identical construction which likewise has three types of luminescent material particles, wherein two types of the luminescent material particles emit radiation in the green region of the electromagnetic spectrum and one type of luminescent material particles emits radiation in the red region of the electromagnetic spectrum, it is possible to generate primarily white, preferably warm white and neutral white, light.

This application claims priority of DE 10 2013 113 188.3, the subject matter of which is incorporated herein by reference.

The description made with reference to examples does not restrict the disclosure to these examples. Rather, the disclosure encompasses any novel feature and combination of features, including in particular any combination of features in the appended claims, even if the feature or combination is not itself explicitly indicated in the claims or examples.

The invention claimed is:

1. A luminescence conversion element for wavelength conversion of primary electromagnetic radiation into secondary electromagnetic radiation, comprising:
   first luminescent material particles that, when excited by the primary electromagnetic radiation, emit a first electromagnetic radiation, a peak wavelength of which is at least 515 nm to at most 550 nm of a green region of the electromagnetic spectrum;
   second luminescent material particles that, when excited by the primary electromagnetic radiation, emit a second electromagnetic radiation, a peak wavelength of which is at least 595 nm to at most 612 nm of a yellow-red region of the electromagnetic spectrum; and
   third luminescent material particles that, when excited by the primary electromagnetic radiation, emit a third electromagnetic radiation, a peak wavelength of which is at least 625 nm to at most 660 nm of a red region of the electromagnetic spectrum,
   wherein
   the first, second and third luminescent material particles each consist of different materials,
   a peak wavelength of the primary radiation lies in a blue region of the electromagnetic spectrum,
   the luminescence conversion element, when excited energetically by the primary radiation, emits secondary radiation containing the first, second and third electromagnetic radiation, and
   a correlated color temperature of a mixed radiation consisting of portions of the primary radiation and the secondary radiation corresponds to a color temperature of white light.

2. The luminescence conversion element according to claim 1, wherein the correlated color temperature of the mixed radiation corresponds to the color temperature of neutral white or warm white light.

3. The luminescence conversion element according claim 1, wherein the luminescence conversion element exclusively contains luminescent material particles or exclusively consists of luminescent material particles that, when excited by the primary radiation, emit the first, second and third electromagnetic radiation.

4. The luminescence conversion element according to claim 1, wherein the peak wavelength of the first electromagnetic radiation and the peak wavelength of the second electromagnetic radiation differ from one another by at least 20 nm to at most 100 nm.

5. The luminescence conversion element according to claim 1, wherein the peak wavelength of the second electromagnetic radiation and the peak wavelength of the third electromagnetic radiation differ from one another by at least 2 nm to at most 60 nm.

6. The luminescence conversion element according to claim 1, wherein the peak wavelength of the second electromagnetic radiation and the peak wavelength of the third electromagnetic radiation differ from one another by at least 25 nm to at most 50 nm.

7. The luminescence conversion element according to claim 1, wherein the peak wavelength of the second electromagnetic radiation is 595 nm to 612 nm.

8. The luminescence conversion element according to claim 1, wherein
   the first luminescent material particles are formed with $(Y,Lu,Gd,Th,Ce)_3(Al,Ga)_5O_{12}$,
   the second luminescent material particles and the third luminescent material particles are formed with $(Sr,Ba,Ca,Mg)_2Si_5N_8$:Eu and/or $(Sr,Ca)AlSiN_3$:E.

9. The luminescence conversion element according to claim 1, wherein, in addition to the first, second and third luminescent material particles, the luminescence conversion element contains radiation-scattering particles that do not have any converting effect.

10. The luminescence conversion element according to claim 1, wherein a color rendering index of the mixed radiation, formed with the primary radiation and the secondary radiation has a value of at least 80.

11. A optoelectronic semiconductor component comprising:
the luminescence conversion element according to claim 1; and
at least one optoelectronic semiconductor chip that emits the primary radiation when in operation,
wherein
the luminescence conversion element is arranged downstream of the optoelectronic semiconductor chip such that at least a portion of the primary radiation emitted by the at least one optoelectronic semiconductor chip enters the luminescence conversion element, and
the optoelectronic semiconductor component emits the mixed radiation.

12. The optoelectronic semiconductor component according to claim 11, wherein the luminescence conversion element covers a radiation exit face of the at least one optoelectronic semiconductor chip at least in places.

13. The optoelectronic semiconductor component according to claim 11, wherein a luminous efficacy of the optoelectronic semiconductor component is greater than that of an optoelectronic semiconductor component of otherwise identical construction with an identical color rendering index, but with a luminescence conversion element formed with fewer than three different luminescent material particles.

14. A method of producing an optoelectronic semiconductor component that emits white light of a predefinable color temperature, comprising:
providing the luminescence conversion element according to claim 1, wherein
a respective concentration of the first luminescent material particles, the second luminescent material particles and the third luminescent material particles in the luminescence conversion element is selected such that the mixed radiation consisting of the primary radiation emitted by the at least one optoelectronic semiconductor chip and secondary radiation generated by the luminescence conversion element has a predefinable color temperature.

15. The method according to claim 14, wherein a concentration and/or the number of the second and/or third luminescent material particles in the luminescence conversion element is selected in relation to the concentration and/or the number of the first luminescent material particles such that the mixed radiation has the predefinable color temperature.

16. The method according to claim 14, wherein a concentration and/or the number of the second and/or third luminescent material particles in the luminescence conversion element is reduced in relation to a concentration and/or the number of the first luminescent material particles as the predefinable color temperature of the mixed radiation falls.

17. The method according to claim 14, wherein a concentration and/or the number of the third luminescent material particles in the luminescence conversion element is selected in relation to a concentration and/or the number of the first and/or second luminescent material particles such that the color rendering index of the mixed radiation has a value of at least 80.

18. The luminescence conversion element according to claim 1, wherein the peak wavelength of the second electromagnetic radiation is at least 590 nm to at most 607 nm.

19. A luminescence conversion element for wavelength conversion of primary electromagnetic radiation into secondary electromagnetic radiation, comprising:
first luminescent material particles that, when excited by the primary electromagnetic radiation, emit a first electromagnetic radiation, a peak wavelength of which lies in a green region of the electromagnetic spectrum;
second luminescent material particles that, when excited by the primary electromagnetic radiation, emit a second electromagnetic radiation, a peak wavelength of which lies in a yellow-red region of the electromagnetic spectrum; and
third luminescent material particles that, when excited by the primary electromagnetic radiation, emit a third electromagnetic radiation, a peak wavelength of which lies in a red region of the electromagnetic spectrum,
wherein
the peak wavelength of the primary radiation lies in a blue region of the electromagnetic spectrum,
the luminescence conversion element, when excited energetically by the primary radiation, emits secondary radiation containing the first, second and third radiation, and
a correlated color temperature of a mixed radiation consisting of portions of the primary radiation and the secondary radiation, corresponds to a color temperature of white light.

* * * * *